United States Patent [19]
Nuckolls et al.

[11] Patent Number: 5,381,116
[45] Date of Patent: Jan. 10, 1995

[54] METHOD AND APPARATUS FOR PERFORMING FREQUENCY TRACKING IN AN ALL DIGITAL PHASE LOCK LOOP

[75] Inventors: Charles E. Nuckolls; James R. Lundberg, both of Austin, Tex.

[73] Assignee: Motorola, Inc., Schaumburg, Ill.

[21] Appl. No.: 165,682

[22] Filed: Dec. 13, 1993

[51] Int. Cl.$^6$ .......................................... H03L 7/087
[52] U.S. Cl. ..................... 331/1 A; 331/17; 331/25; 327/159
[58] Field of Search ...................... 331/1 A, 17, 11, 25; 328/155

[56] References Cited

U.S. PATENT DOCUMENTS

| | | | |
|---|---|---|---|
| 4,577,163 | 3/1986 | Culp | 331/1 A |
| 4,795,985 | 1/1989 | Gailbreath, Jr. | 328/155 |
| 5,122,761 | 6/1992 | Wischermann | 331/1 A |

Primary Examiner—Siegfried H. Grimm
Attorney, Agent, or Firm—Charlotte B. Whitaker

[57] ABSTRACT

An all digital phase lock loop (ADPLL), (10) includes a variable digital oscillator (DCO 16), a phase detector (12), a controller (13) including an incrementor (19) and decrementor (21), and a set of oscillator control registers (22). A frequency tracking circuit (20) is separated from the phase acquisition/maintenance logic circuitry. The frequency tracking circuitry (20) uses an anchor value to maintain and update a DCO control value corresponding to a target frequency of operation of the DCO (16). Updates to the anchor value are facilitated by monitoring recent history of an output control signal (ahead or behind) provided by the phase detector (12). The anchor value is changed to maintain the target frequency of operation of the DCO (16), even in the presence of variations in operating environments.

17 Claims, 2 Drawing Sheets

METHOD AND APPARATUS FOR PERFORMING FREQUENCY TRACKING IN AN ALL DIGITAL PHASE LOCK LOOP

FIELD OF THE INVENTION

This invention relates generally to digital phase locked loops, and more particularly to a frequency tracking mechanism in a digital phase locked loop systems.

CROSS-REFERENCE TO RELATED APPLICATIONS

This application is related to the following applications:
1. "METHOD AND APPARATUS FOR PERFORMING FREQUENCY DETECTION", Ser. No. 08/165,685 by Lundberg et al.;
2. "METHOD AND APPARATUS FOR DETERMINING A CONSTANT GAIN OF A VARIABLE OSCILLATOR", Ser. No. 08/165,687, by Lundberg et al.;
3. "METHOD AND APPARATUS FOR PERFORMING FREQUENCY ACQUISITION IN AN ALL DIGITAL PHASE LOCK LOOP", Ser. No. 08/165,685 by Nuckolls et al.;
4. "METHOD AND APPARATUS FOR PERFORMING PHASE ACQUISITION IN AN ALL DIGITAL PHASE LOCK LOOP", Ser. No. 08/165,681, by Nuckolls et al. All of which are filed simultaneously herewith and assigned to the assignee hereof.

BACKGROUND OF THE INVENTION

Generally, the implementation of a phase-locked loop (PLL) requires the acquisition of an appropriate frequency and phase using an internal ring oscillator. Analog phase-locked loops typically use a voltage-controlled oscillator (VCO) to generate a period signal that is "locked" to a reference clock signal. The frequency of the VCO is modulated by an analog voltage adjusted via a feedback mechanism. Typically, the feedback mechanism is supplied from a sequential phase/frequency detector. The sequential phase/frequency detector outputs an "up" or "down" pulse proportional to phase error width and in the direction required to pull in the frequency of the VCO output signal to the target reference clock signal. The output of a sequential phase/frequency detector usually enables a charge pump driving a loop filter (RC), which in turn controls the frequency of the VCO. The detector outputs can be arbitrarily small, and thus there is usually a dead band associated with such a detector where, for a certain window of time, there is no detectable output. Accordingly, during the dead band ("window width"), the PLL can detect neither "up" nor "down" pulses for a phase/frequency error of a magnitude equal to or less than the window width. This technique has been used in many applications, and requires careful tuning to maintain the right damping characteristics.

In the PLL, the gain of the VCO is defined as dF/dV (the change in VCO frequency per change in the analog control voltage). The maximum change in frequency occurs when there is a maximum amount of phase error during a given cycle (maximum dV). The change in analog control voltage (dV), depends on many parameters, such as, the charge pump, loop filter, etc. Consequently, the loop gain of the PLL requires careful tuning of these parameters to maintain the right damping characteristics. If the gain is too high, the PLL will be unstable, resulting in excessive jitter or loss of lock. Conversely, if the gain is too low, the PLL may not be able to track frequency drift due to fluctuations in the reference frequency, $V_{DD}$, or temperature. Thus, the gain (dF/dV) must be constrained, which causes the PLL to suffer unnecessary time penalties during phase and frequency acquisition.

Once a PLL has acquired phase-lock, a mechanism must be provided such that the operating point of the PLL can move due to changes in temperature, voltage or reference clock frequency. For example, as a microprocessor heats up, the oscillator will slow down. To maintain the correct frequency/phase relationship, the controlling logic must compensate in a way to speed up the oscillator frequency. Similarly, increases or decreases in supply voltage require the frequency to change. In systems, it is not unusual for the reference clock to change frequencies, either to optimize power/performance, or to minimize electro-magnetic interference effects.

SUMMARY OF THE INVENTION

The present invention provides a method and apparatus for performing frequency tracking in an all digital phase lock loop (ADPLL). The ADPLL includes a variable digital oscillator (DCO), a phase detector, a controller including an incrementor and decrementor, and a set of oscillator control registers. A frequency tracking circuit is separated from the phase acquisition/maintenance logic circuitry. The frequency tracking circuitry maintains and updates a DCO control value that corresponds to a target frequency of operation of the DCO. Updates to the DCO control value are facilitated by monitoring recent history of an output control signal (ahead or behind) provided by the phase detector. The DCO control value is changed to maintain the target frequency of operation of the DCO, even in the presence of variations in operating environments. Thus, the present invention provides a mechanism for maintaining a constant frequency of oscillator operation despite changes in temperature, voltage or other environmental conditions.

DETAILED DESCRIPTION OF A PREFERRED EMBODIMENT

Figure 1:
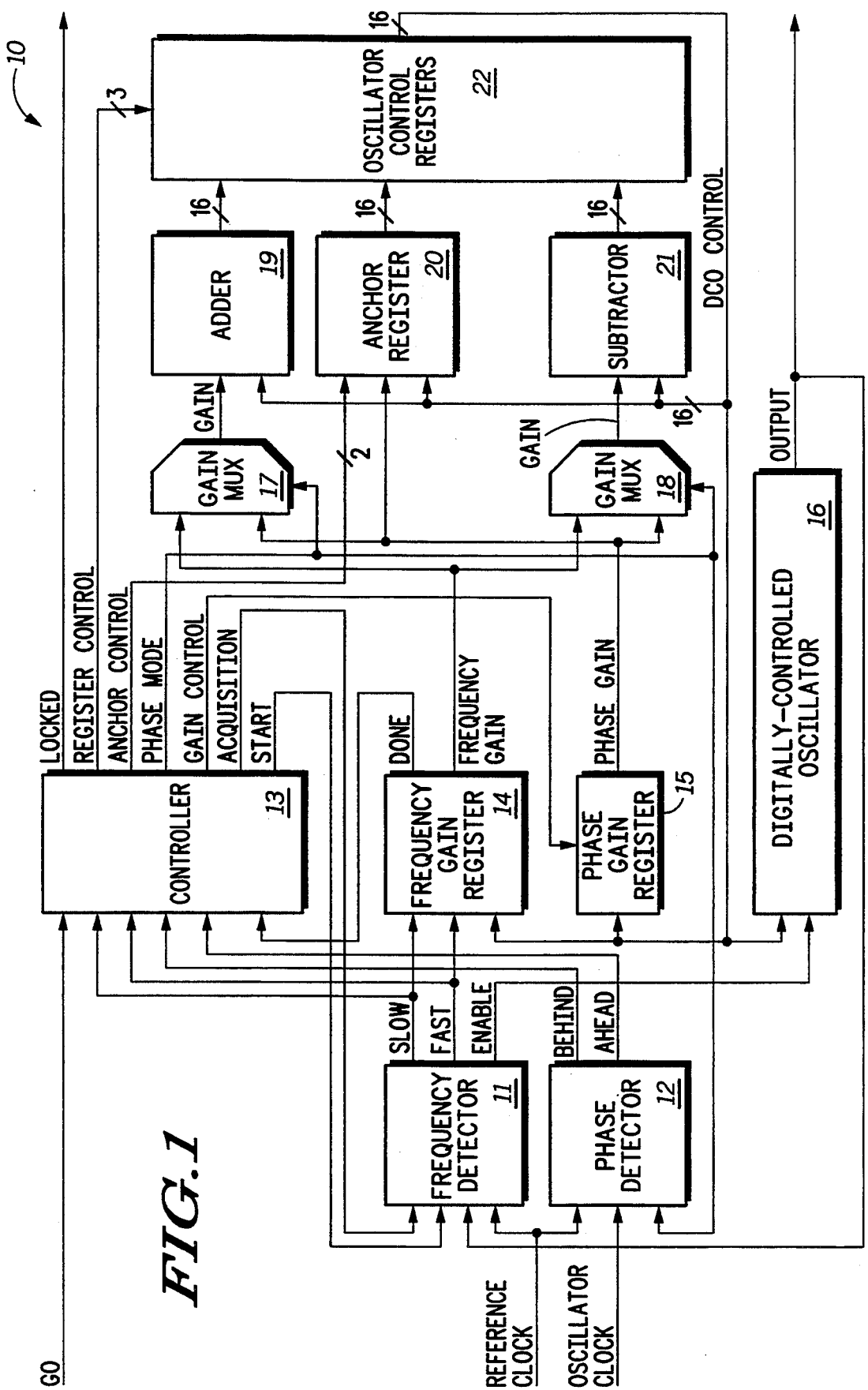
FIG. 1 illustrates in block diagram form an all digital phase lock loop in accordance with a preferred embodiment of the present invention.

The present invention can be more fully described with reference to FIGS. 1 and 2. Illustrated in FIG. 1 is a block diagram of an all digital phase-locked loop (ADPLL) 10, in accordance with a preferred embodiment of the present invention. In a preferred embodiment, the ADPLL 10 has four modes of operation, frequency acquisition, phase acquisition, phase maintenance and frequency maintenance. The ADPLL 10 includes a frequency detector 11, a phase detector 12, a controller 13, frequency and phase gain registers 14 and 15, respectively, a digitally-controlled oscillator (DCO)

16, gain multiplexors 17 and 18, adder 19, anchor register 20, and subtractor 21. The DCO 16 uses a sixteen bit binarily-weighted control signal (DCO CONTROL) to implement changes in the frequency and phase of the DCO output, as disclosed in a patent application entitled "Delay Element with Digitally Controllable Gain" Ser. No. 07/993,757, by Lundberg et al. filed on Dec. 21, 1992 and assigned to the assignee hereof. The binary value of these control signals determines the frequency of the DCO 16. The DCO 16 has a gain which is defined as dF/d(DCO CONTROL). Thus, the larger the change in the binary value held by the DCO CONTROL signals, the larger the change in the frequency of the DCO 16. Accordingly, the frequency of the DCO 16 is changed via arithmetic increments or decrements to the 16 control bits of the DCO CONTROL signal.

The ADPLL 10 starts in the frequency acquisition mode. In the frequency acquisition mode, the DCO control register 22 is initialized to a value of $4000 (where "$" refers to a hexadecimal value), in accordance with a preferred embodiment. Starting with a frequency gain of $2000, provided by the frequency gain register 14, and using a modified binary search algorithm, the DCO control register 22 is updated based on the output signal provided by the frequency detector 11. During frequency acquisition, the frequency detector 11 performs a digital frequency comparison between the reference clock signal and the OUTPUT signal provided by the DCO 16, and outputs a FAST or SLOW signal every two reference clock cycles (every other reference clock boundary). The FAST or SLOW digital signal initiates an increment or decrement to the DCO control register 22. The magnitude of the increments or decrements to the DCO control register 22 (the frequency gain), is dictated by the frequency gain register 14. In a preferred embodiment, the gain is reduced every time a change in search direction occurs (i.e. a shift in the frequency gain register 14 occurs). Accordingly, one shift in the frequency gain register 14 causes a reduction in frequency gain by a factor of four, but only for one of either the subtract gain value or the add gain value. On successive shifts, gain reduction alternates between the add gain value and the subtract gain value. On every change in search direction, the frequency gain is reduced by a factor of two, as illustrated in Table I below.

In accordance with a preferred embodiment of the present invention, there is a one-to-one mapping of frequency gain weights to DCO CONTROL weights; for instance, an add gain value of $4000 would present an increment to the DCO CONTROL value of 100% if the DCO CONTROL value was $4000, as demonstrated in the first frequency detect cycle of Table I. When the frequency gain value stored in the frequency gain register 14 is less than the DCO CONTROL value stored in the DCO control register 22 bit-shifted right by ten bit positions, a frequency match has occurred between the reference clock signal and the output of the DCO 16 to an error of one in $2^{10}$ or ±0.1%. The ADPLL 10 then completes frequency acquisition by transferring the value in the DCO control register 22 to the anchor register 20, thereby storing the baseline frequency value in the anchor register 20.

TABLE I

| Frequency Detector Output/Cycle Initial | Add Gain $4000 | Subtract Gain $2000 | DCO CONTROL $4000 |
|---|---|---|---|
| Cycle 1. SLOW Result: | $4000 | $2000 | $8000 |
| Cycle 2. FAST Result: | $1000 | $2000 | $6000 |
| Cycle 3. SLOW Result: | $1000 | $800 | $7000 |
| Cycle 4. SLOW Result: | $1000 | $800 | $8000 |
| Cycle 5. FAST Result: | $400 | $800 | $7800 |
| Cycle 6. SLOW Result: | $400 | $200 | $7C00 |
| Cycle 7. FAST Result: | $100 | $200 | $7A00 |
| Cycle 8. SLOW Result: | $100 | $80 | $7B00 |
| Cycle 9. SLOW Result: | $100 | $80 | $7C00 |
| Cycle 10. FAST Result: | $40 | $80 | $7B80 |

Phase acquisition aligns the buffered output (divided by two) of the DCO 16 to the reference clock signal. Using the output of the DCO 16 rather than a global clock has two benefits. First, the global clock(s) can be turned off to save power during phase lock. Second, since the DCO 16 output runs at two times the reference clock frequency, the maximum phase error is reduced from 180° to 90°. During phase acquisition, on every reference clock signal, the phase detector 12 outputs a digital signal "AHEAD" or "BEHIND". The DCO control register 22 is incremented or decremented (in one direction only) every cycle by the gain value stored in the phase gain register 15, until a change in polarity of the phase error is detected. The phase gain register 15 dictates the magnitude of phase corrections. In the preferred embodiment, the phase gain register 15 performs a bit-shift right of the binary (DCO CONTROL) value currently held in the DCO control register 22, and stores this bit-shifted (gain) value of the DCO CONTROL value (base frequency). For a maximum phase error of 90°, the number of required phase corrections, n, as a function of shift displacement, d, can be approximated by equation 1.1 below:

$$n = \frac{-1 + \sqrt{1 + 2^{(d+1)}}}{2} \qquad \text{Eqn. 1.1}$$

Upon detecting the change in the polarity of the phase error, the ADPLL 10 completes phase lock by loading the value stored in the anchor register 20 into the DCO control register 22, thereby restoring the DCO control register 22 to the baseline frequency. In a preferred embodiment, during phase acquisition, the shift displacement (d) in the phase gain register 15 is eight, giving a worst case acquisition of eleven cycles.

When phase acquisition is complete, phase-locking has been achieved, and the ADPLL 10 enters a phase/frequency maintenance mode of operation. During phase maintenance, the DCO control register 22 is incremented or decremented every cycle (based on the output of the phase detector 12) by the gain value stored in the phase gain register 15, unless a change in the polarity of the phase error is detected. If a change in the polarity of the phase error is detected, the value stored in the anchor register 20 is loaded into the DCO control register 22 to restore the baseline frequency. Also, when a change in phase error polarity is detected, the shift displacement of the phase-gain register 15 is incremented (unless the shift displacement is at a maximum value), thereby reducing the phase gain by a factor of two. In a preferred embodiment, if a change in polarity is not detected for eight consecutive phase cycles, the phase gain shift displacement is decremented (unless the shift displacement is at a minimum value), thereby increasing the phase gain by a factor of two. This mechanism allows the phase gain to change as operating conditions warrant.

Frequency maintenance occurs simultaneously with phase maintenance. In accordance with the preferred embodiment, the anchor register 20 is updated during frequency maintenance, thereby changing the baseline frequency of operation of the DCO 16. After phase acquisition, if four consecutive increments of the DCO control register 22 occur, then the anchor register 20 is incremented once. Similarly, if four consecutive decrements of the DCO control register 22 occur, the anchor register 20 is decremented once. This mechanism allows the baseline frequency to track as operating conditions change with time.

Figure 2:
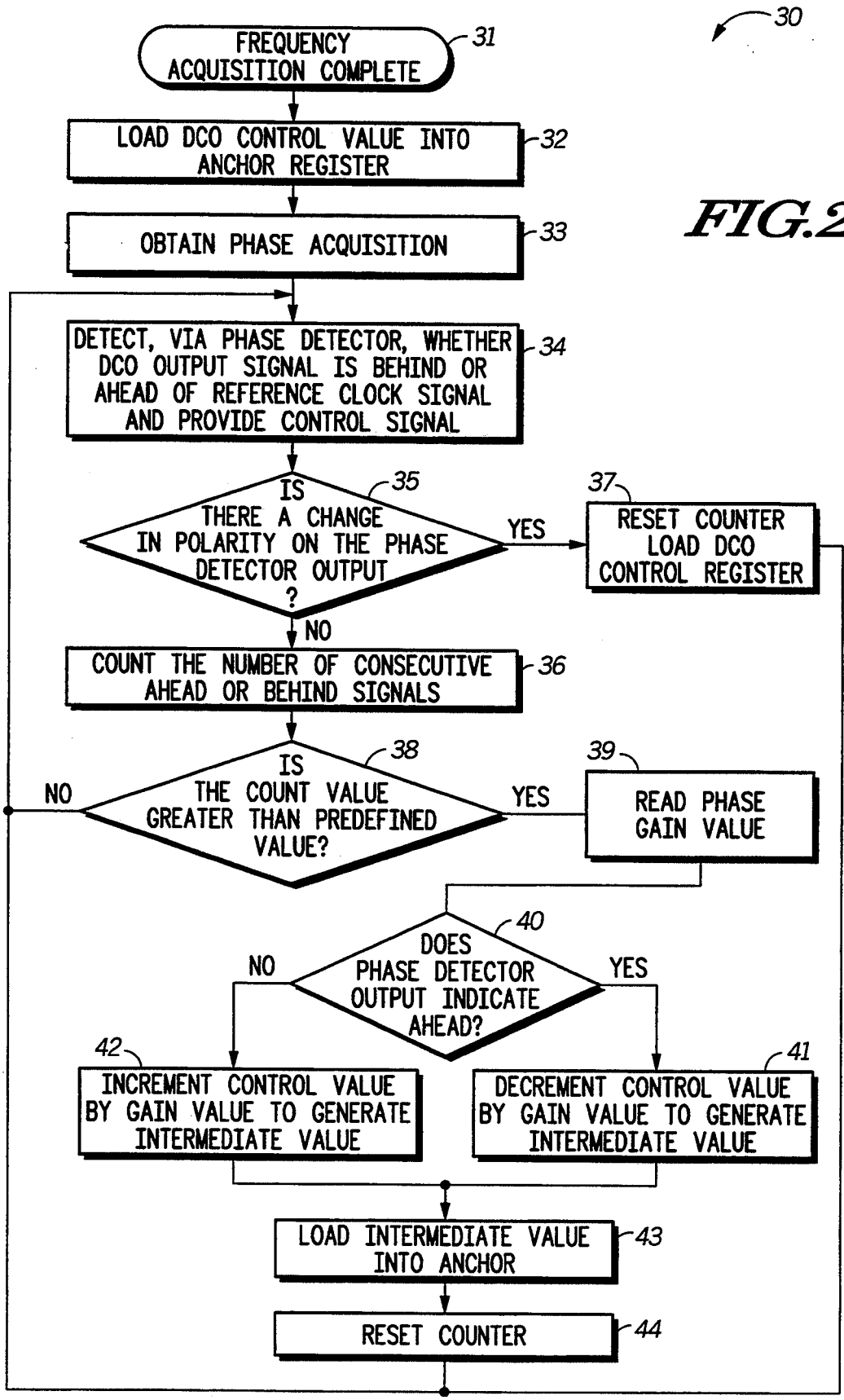
FIG. 2 illustrates in flow diagram form a method for performing frequency tracking in the all digital phase lock loop of FIG. 1, in accordance with the present invention.

Illustrated in FIG. 2 is a flow diagram 30 for performing frequency tracking, in accordance with the present invention. Upon completion of frequency acquisition, at step 31, the DCO CONTROL value corresponds to the target frequency of operation of the DCO 16, for the current operating conditions. Thus, at step 32, the DCO CONTROL value is stored in the anchor register 20 as the baseline target frequency (anchor) value. The ADPLL 10 then proceeds to obtain phase acquisition, as described in a related application entitled "METHOD AND APPARATUS FOR PERFORMING PHASE ACQUISITION IN AN ALL DIGITAL PHASE LOCK LOOP", Ser. No. 08/165,681, by Nuckolls et al. assigned to the assignee hereof. During phase acquisition, the frequency of the DCO 16 is modified to bring a buffered output (OSCILLATOR CLOCK) signal of the DCO 16 into alignment with the REFERENCE CLOCK signal. The anchor value stored in the anchor register 20 is maintained as a means of restoring the baseline target frequency once phase acquisition is completed. Phase acquisition is complete when the two clock edges (OSCILLATOR CLOCK signal and REFERENCE CLOCK signal) are forced to be coincident.

In accordance with a preferred embodiment, the phase detector 12 includes two edge-triggered D-flip-flops (not shown) in series, which implement a synchronizer, clocked by the REFERENCE CLOCK signal. The phase detector 12 detects whether the OSCILLATOR CLOCK signal of the DCO 16 is ahead of or behind the REFERENCE CLOCK signal by capturing the binary value of the OSCILLATOR CLOCK signal on the rising edge of the REFERENCE CLOCK signal. Thus, at step 34, if a logic "1" is captured, the OSCILLATOR CLOCK signal of the DCO 16 is ahead of the REFERENCE CLOCK signal; otherwise, the OSCILLATOR CLOCK signal is behind. If "AHEAD" is indicated by the phase detector 12, the DCO 16 must decrease the frequency of the OUTPUT signal; this is accomplished by decrementing the DCO CONTROL value stored in the DCO control register 22. Conversely, if "BEHIND" is indicated by the phase detector 12, the DCO 16 must increase the frequency of the OSCILLATOR CLOCK signal provided by the DCO 16; this being accomplished by incrementing the DCO CONTROL value stored in the DCO control register 22.

At decision block 35, if a current control signal provided by the phase detector 12 differs from that of a previous cycle, then the phase error has gone from positive to negative or vice-versa. This causes a change in polarity of the output control signal provided by the phase detector 12. A counter (not shown) in the controller 13 keeps track of the number of consecutive phase error samples that have been in the same direction, as indicated at step 36. If phase alignment has occurred, then the counter is reset to zero, and the DCO control register 22 is updated with the contents of the anchor register 20, at step 37, to thereby restore the target frequency. If the count value is greater than a predefined number (e.g. four), then there have been at least four corrections to the DCO CONTROL value without achieving phase alignment. The occurrence of this condition indicates that the anchor register 20 should be modified to correspond to the target frequency, as indicated by decision block 38. At step 39, the phase gain value is read from the phase gain register 15.

As indicated by steps 40–42, the output control signal provided by the phase detector 12 determines whether the gain value is added to or subtracted from the anchor value, stored in the anchor register 20, to generate an intermediate anchor value. In either case, the intermediate anchor value is loaded into the anchor register 20, at step 43, and thereby becomes the new baseline target frequency. Accordingly, the generation of the intermediate anchor value is based on whether the phase detector 12 indicates that the OSCILLATOR CLOCK signal is slower (i.e. behind) or faster than (i.e. ahead of) the REFERENCE CLOCK signal. Thus, in response to changes in operating conditions, the anchor value is adjusted to ensure that the DCO 16 maintains the proper (target) frequency of operation. Accordingly, the intermediate anchor value is generated by logic within the anchor register 20. A new baseline frequency of operation for the DCO 16 is established by loading the intermediate anchor value into the DCO control register 22, thereby causing the intermediate anchor value to become the new DCO CONTROL value, upon a change in phase-error polarity. In the preferred embodiment, REGISTER CONTROL signals provided by the controller 13 control the loading of the new DCO CONTROL value in the DCO control register 22. The counter in controller 13 is reset to zero, at step 44, causing the controller 13 to wait for a predefined number of consecutive corrections in the one direction before updating the anchor register 20 again.

Thus, the present invention provides a mechanism (anchor register 20) by which an all digital phase lock loop 10 can track frequency drift in an oscillator (DCO 16) due to the effects of temperature or voltage, resulting in improved stability across the phase lock loop's operation conditions. In the present invention, following frequency and phase acquisition, the controller 13 loads the anchor register 20 with the DCO CONTROL value corresponding to the baseline target frequency. While maintaining phase alignment, each time the phase error changes polarity, the DCO 16 is restored to the baseline frequency of operation by loading the value stored in the anchor register 20 into the DCO control register 22. This process reduces phase overshoot and decreases jitter in the ADPLL 10. As operating conditions change or if the reference clock frequency varies, additions or subtractions to the anchor value stored in the anchor register 20 are made, under the control of the controller 13. Accordingly, if four consecutive phase increments of the DCO 16 occur, then the anchor register 20 is incremented once by the phase gain value stored in the phase gain register 15. Similarly, if four consecutive phase decrements of the DCO 16 occur, the anchor value is decremented once. Thus, in the present invention, the anchor register 20 is capable of tracking a variety of input variations to frequency while ensuring that the DCO 16 maintains the proper baseline frequency. Furthermore, the anchor register 20 may track variations or drift in the reference clock frequency, and operate to maintain the proper baseline frequency.

While the present invention has been described in accordance with a preferred embodiment, it should be apparent to one of ordinary skill in the art that the invention may be practiced in numerous ways. Accordingly, it is intended by the appended claims to cover all modifications of the invention which fall within the true spirit and scope of the invention.

We claim:

1. In a system having a digitally controlled variable oscillator and a phase detector for comparing a rising edge of a reference clock signal to a rising edge of an oscillator output signal, a controller coupled to said oscillator, a set of oscillator control registers and a logic circuit for controlling frequency operation of said digitally controlled variable oscillator, a method for performing frequency tracking after said system completes frequency and phase acquisition, said method comprising the steps of:

a) loading a control value from a first oscillator control register into a second oscillator control register in a logic circuit, said control value initially corresponding to a target frequency of said digitally controlled variable oscillator;
    b) determining, via said controller, whether said phase detector has provided either a consecutive number of ahead output signals or a consecutive number of behind output signals, during a predefined number of cycles, and providing an oscillator control signal indicative thereof;
    c) incrementing or decrementing said control value stored in said second control register by a gain value stored in a third control register to determine an intermediate control value, in response to said oscillator control signal; and
    d) loading said intermediate control value stored in said second control register into said first control register when said phase detector indicates a change in polarity.

2. The method of claim 1 wherein said step of determining, via said controller, whether said phase detector has provided either a consecutive number of ahead output signals or a consecutive number of behind output signals, during a predefined number of cycles, and providing an oscillator control signal indicative thereof comprises the step of detecting, via said phase detector, whether said rising edge of said oscillator output signal is behind of or ahead said rising edge of said reference clock signal and providing a phase detector output signal indicative thereof, said controller counting the number of consecutive ahead output signals or behind output signals provided by said phase detector.

3. The method of claim 1 wherein steps a) through d) are repeated by said system during maintenance of phase and frequency lock.

4. In a system having a digitally controlled variable oscillator and a phase detector for comparing a rising edge of a reference clock signal to a rising edge of an oscillator output signal, a controller coupled to said oscillator, a set of oscillator control registers and a logic circuit for controlling frequency operation of said digitally controlled variable oscillator, a method for performing frequency tracking after said system completes frequency and phase acquisition, said method comprising the steps of:

a) loading a control value from a first oscillator control register into a second oscillator control register in a logic circuit, said control value initially corresponding to a target frequency of said digitally controlled variable oscillator;
    b) detecting, via said phase detector, whether said rising edge of said oscillator output signal is behind of or ahead said rising edge of said reference clock signal, and providing a phase detector output signal indicative thereof;
    c) determining, via said controller, whether said phase detector has provided either a consecutive number of ahead output signals or a consecutive number of behind output signals, during a predefined number of cycles, and providing an oscillator control signal indicative thereof;
    d) incrementing or decrementing said control value stored in said second control register by a gain value stored in a third control register to determine an intermediate control value, in response to said oscillator control signal; and
    e) loading said intermediate control value stored in said second control register into said first control register when said phase detector indicates a change in polarity.

5. The method of claim 4 wherein said step of incrementing or decrementing said control value stored in said second control register by a gain value stored in a third control register to determine an intermediate control value, in response to said oscillator control signal is performed by said logic circuit in response to said controller indicating, via said oscillator control signal, that said phase detector has provided said consecutive number of behind output signals or said consecutive number of ahead output signals, respectively.

6. In a system having a digitally controlled variable oscillator and a phase detector for comparing a rising edge of a reference clock signal to a rising edge of an oscillator output signal, and a controller coupled to said oscillator and a set of oscillator control registers, a method for performing frequency tracking after said system completes frequency and phase acquisition, said method comprising the steps of:

a) loading a control value from a first oscillator control register into a second oscillator control register, said control value initially corresponding to a target frequency of said digitally controlled variable oscillator, and said first oscillator control register controlling a frequency of operation of said digitally controlled variable oscillator;
    b) detecting, via said phase detector, whether said rising edge of said oscillator output signal is behind of or ahead said rising edge of said reference clock signal, and providing a phase detector output signal indicative thereof;

c) determining, via said controller, whether said phase detector has provided either a consecutive number of ahead output signals or a consecutive number of behind output signals, during a predefined number of cycles, and providing an oscillator control-signal indicative thereof;

d) incrementing or decrementing said control value stored in said second control register by a gain value stored in a third control register to determine an intermediate control value, in response to said controller indicating, via said oscillator control signal, that said phase detector has provided said consecutive number of behind output signals or said consecutive number of ahead output signals, respectively, and;

e) loading said intermediate control value stored in said second control register into said first control register when said phase detector indicates a change in polarity.

7. The method of claim 6 wherein steps a) through e) are repeated by the system during maintenance of phase and frequency lock.

8. In a system having a digitally controlled variable oscillator, a set of oscillator control registers, and a phase detector for comparing a rising edge of a reference clock signal to a rising edge of an oscillator output signal, a frequency tracking controller for performing frequency tracking after said system completes frequency and phase acquisition, said frequency tracking controller comprising:

an anchor register for storing an oscillator control value, said control value being provided by a first oscillator control register, and said control value initially corresponding to a target frequency of said digitally controlled variable oscillator;

control logic, coupled to said anchor register, for determining whether said phase detector has provided either a consecutive number of ahead output signals or a consecutive number of behind output signals, during a predefined number of cycles, and providing an oscillator control signal indicative thereof; and arithmetic logic, coupled to said control logic and said anchor register, for incrementing or decrementing said oscillator control value stored in said anchor register by a gain value stored in a second oscillator control register to determine an intermediate oscillator control value, in response to said oscillator control signal, and said arithmetic logic loading said intermediate control value into said first control register when said phase detector indicates a change in polarity.

9. The frequency tracking controller of claim 8 wherein said arithmetic logic comprises:

an adder for incrementing said oscillator control value stored in said anchor register by said gain value stored in said second oscillator control register to determine said intermediate oscillator control value, in response to said control logic indicating, via said oscillator control signal, that said phase detector has provided said consecutive number of behind output signals; and a subtractor for decrementing said oscillator control value stored in said anchor register by said gain value stored in said second oscillator control register to determine said intermediate oscillator control value, in response to said control logic indicating, via said oscillator control signal, that said phase detector has provided said consecutive number of ahead output signals.

10. The frequency tracking controller of claim 9 wherein said anchor register stores said intermediate oscillator control value, and loads said intermediate oscillator control value into said first oscillator control register, to restore said digitally controlled variable oscillator to said target frequency, when said phase detector indicates a change in polarity of said phase detector output signal.

11. In a system having a digitally controlled variable oscillator, a set of oscillator control registers, and a phase detector for comparing a rising edge of a reference clock signal to a rising edge of an oscillator output signal and for providing a phase detector output signal indicating whether said rising edge of said oscillator output signal is ahead of or behind said rising edge of said reference clock signal, a frequency tracking controller for performing frequency tracking after said system completes frequency and phase acquisition, said frequency tracking controller comprising:

an anchor register for storing an oscillator control value, said oscillator control value being provided by a first oscillator control register, and said oscillator control value initially corresponding to a target frequency of said digitally controlled variable oscillator;

a control logic, coupled to said anchor register, for determining whether said phase detector has provided either a consecutive number of ahead output signals or a consecutive number of behind output signals, during a predefined number of cycles, and providing an oscillator control signal indicative thereof; and arithmetic logic, coupled to said control logic and said anchor register, for incrementing or decrementing said oscillator control value stored in said anchor register by a gain value stored in a second oscillator control register to determine an intermediate oscillator control value, in response to said oscillator control signal, said arithmetic logic loading said intermediate control value into said anchor register to allow said anchor register to restore said oscillator to said target frequency of operation, when said phase detector indicates a change in polarity of said phase detector output signal.

12. The frequency tracking controller of claim 11 wherein said arithmetic logic comprises:

an adder for incrementing said oscillator control value stored in said anchor register by said gain value stored in said second oscillator control register to determine said intermediate oscillator control value, in response to said control logic indicating, via said oscillator control signal, that said phase detector has provided said consecutive number of behind output signals; and a subtractor for decrementing said oscillator control value stored in said anchor register by said gain value stored in said second oscillator control register to determine said intermediate oscillator control value, in response to said control logic indicating, via said oscillator control signal, that said phase detector has provided said consecutive number of ahead output signals.

13. The frequency tracking controller of claim 11 wherein said anchor register stores said intermediate oscillator control value, and loads said intermediate oscillator control value into said first oscillator control register, to restore said digitally controlled variable oscillator to said target frequency, when said phase detector indicates a change in polarity of said phase detector output signal.

14. A system for performing frequency tracking after said system completes frequency and phase acquisition, said system comprising:

a digitally controlled variable oscillator;

a set of oscillator control registers coupled to said digitally controlled variable oscillator;

a phase detector, coupled to said digitally controlled variable oscillator, for comparing a rising edge of a reference clock signal to a rising edge of an oscillator output signal, and providing a phase detector output signal indicating whether said rising edge of said oscillator output signal is ahead of or behind said rising edge of said reference clock signal;

an anchor register for storing a binarily-weighted oscillator control value, said binarily-weighted oscillator control value being provided by a first oscillator control register, and said binarily-weighted oscillator control value initially corresponding to a target frequency of said digitally controlled variable oscillator;

a control logic, coupled to said anchor register, for determining whether said phase detector has provided either a consecutive number of ahead output signals or a consecutive number of behind output signals, during a predefined number of cycles, and providing an oscillator control signal indicative thereof; and arithmetic logic, coupled to said control logic and said anchor register, for incrementing or decrementing said binarily-weighted oscillator control value stored in said anchor register by a gain value stored in a second oscillator control register, in response to said oscillator control signal, to determine an intermediate oscillator control value, said arithmetic logic loading said intermediate control value into said anchor register to allow said anchor register to restore said oscillator to said target frequency of operation, when said phase detector indicates a change in polarity of said phase detector output signal.

15. The system of claim 14 wherein said control logic maintains a count of a number of consecutive phase error samples that have occurred in a same direction, to determine whether said phase detector has provided either a consecutive number of ahead output signals or a consecutive number of behind output signals, during a predefined number of cycles, and provides said oscillator control signal indicative thereof.

16. The system of claim 14 wherein said arithmetic logic comprises:

an adder for incrementing said oscillator control value stored in said anchor register by said gain value stored in said second oscillator control register to determine said intermediate oscillator control value, in response to said control logic indicating, via said oscillator control signal, that said phase detector has provided said consecutive number of behind output signals; and a subtractor for decrementing said oscillator control value stored in said anchor register by said gain value stored in said second oscillator control register to determine said intermediate oscillator control value, in response to said control logic indicating, via said oscillator control signal, that said phase detector has provided said consecutive number of ahead output signals.

17. The system of claim 15 wherein said anchor register is updated with said intermediate oscillator control value when said control logic indicates that said count of said number of consecutive phase error samples that have occurred in a same direction equals or exceeds a predefined number, and said anchor register thereafter loads said intermediate oscillator control value into said first oscillator control register, to restore said digitally controlled variable oscillator to said target frequency.

* * * * *